(12) United States Patent
Angel et al.

(10) Patent No.: US 7,279,687 B2
(45) Date of Patent: Oct. 9, 2007

(54) TECHNIQUE FOR IMPLEMENTING A VARIABLE APERTURE LENS IN AN ION IMPLANTER

(75) Inventors: Gordon C. Angel, Salem, MA (US); Svetlana B. Radovanov, Marblehead, MA (US); Edward D. Macintosh, Amesbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 242 days.

(21) Appl. No.: 11/212,099

(22) Filed: Aug. 26, 2005

(65) Prior Publication Data

US 2007/0045557 A1 Mar. 1, 2007

(51) Int. Cl.
*H01J 37/147* (2006.01)
*H01J 37/15* (2006.01)

(52) U.S. Cl. .................... 250/396 R; 250/492.21; 250/492.23; 250/505.1

(58) Field of Classification Search .............. None
See application file for complete search history.

(56) References Cited

U.S. PATENT DOCUMENTS 5,780,863 A 7/1998 Benveniste et al.

2006/0289801 A1* 12/2006 Matsuba ............... 250/492.21

FOREIGN PATENT DOCUMENTS

| GB | 2 265 729 A | 10/1993 |
|----|----|----|
| GB | 2 336 029 A | 10/1999 |
| JP | 01 097362 | 4/1999 |

OTHER PUBLICATIONS

PCT International Search Report; European Patent Office (ISA); mailed Mar. 2, 2007; 4 pages.
PCT Written Opinion of the International Searching Authority; European Patent Office (ISA); 5 pages.

* cited by examiner

*Primary Examiner*—Nikita Wells
(74) *Attorney, Agent, or Firm*—Hunton & Williams LLP

(57) ABSTRACT

A technique for implementing a variable aperture lens in an ion implanter is disclosed. In one particular exemplary embodiment, the technique may be realized as a variable aperture lens. The variable aperture lens may comprise a first electrode element. The variable aperture lens may also comprise a second electrode element. The variable aperture lens may further comprise a driver assembly coupled to at least one of the first and the second electrode elements, wherein the driver assembly alters an aperture between the first and the second electrode elements based on a geometry of an ion beam.

17 Claims, 6 Drawing Sheets

US 7,279,687 B2

TECHNIQUE FOR IMPLEMENTING A VARIABLE APERTURE LENS IN AN ION IMPLANTER

FIELD OF THE DISCLOSURE

The present disclosure relates generally to semiconductor fabrication equipment and, more particularly, to a technique for implementing a variable aperture lens in an ion implanter.

BACKGROUND OF THE DISCLOSURE

Ion implanters are widely used in semiconductor manufacturing to selectively alter the conductivity of various electronic materials. In a typical ion implanter, ions generated from an ion source are directed through a series of beam-line components which include one or more analyzing magnets and a plurality of electrodes. The analyzing magnets select the desired ion species, filter out contaminant species and energies, and adjust the beam quality at the wafer. The electrodes modify the energy and shape of the ion beam.

FIG. 1 shows a known ion implanter 100 which comprises an ion source 102, extraction electrodes 104, a 90° magnet analyzer 106, a first deceleration (D1) stage 108, a 70° magnet 110, and a second deceleration (D2) stage 112. The D1 and D2 deceleration stages (also known as "deceleration lenses") are each comprised of multiple electrodes with a defined aperture to allow ions to pass therethrough. By applying different combinations of voltage potentials to the D1 and D2 deceleration stages, the ion implanter 100 may operate in different modes. For example, in a process chamber deceleration (PCD) mode, no voltage potential is applied to the D1 electrodes, such that the ion beam drifts until it reaches the D2 electrodes. In a double deceleration (DD) mode, however, deceleration potentials are applied to both D1 and D2 electrodes, so that the ions are decelerated at both stages.

Traditional ion implanters are ill-fitted to varying modes of beam operation. When an ion implanter is switched from one operation mode to another, there may be a significant change in the ion beam geometry. For example, in the ion implanter 100 illustrated in FIG. 1, a ribbon-shaped ion beam that has been decelerated at the D1 stage typically has a current density distribution that is significantly taller than a beam that has not been decelerated at the D1 stage. That is, the ion beam tends to be taller when it reaches the D2 stage if the ion implanter 100 is operating in DD mode than if it is operating in PCD mode. In traditional ion implanters, the D2 deceleration lens typically has a fixed aperture that is just wide enough to accommodate the vertical height of the ion beam in DD mode. However, in PCD mode, the aspect ratio of the fixed aperture provides poor or no vertical focusing of the shorter ion beam, which often leads to an excessive beam height as well as difficulties in uniformity tuning.

In view of the foregoing, it would be desirable to provide a solution which overcomes the above-described inadequacies and shortcomings.

SUMMARY OF THE DISCLOSURE

A technique for implementing a variable aperture lens in an ion implanter is disclosed. In one particular exemplary embodiment, the technique may be realized as a variable aperture lens. The variable aperture lens may comprise a first electrode element. The variable aperture lens may also comprise a second electrode element. The variable aperture lens may further comprise a driver assembly coupled to at least one of the first and the second electrode elements, wherein the driver assembly alters an aperture between the first and the second electrode elements based on a geometry of an ion beam.

In accordance with other aspects of this particular exemplary embodiment, the aperture may be altered based on a geometry of the ion beam before the ion beam enters the aperture.

In accordance with further aspects of this particular exemplary embodiment, the aperture may be altered according to a desired geometry of the ion beam after the ion beam passes through the aperture.

In accordance with additional aspects of this particular exemplary embodiment, the first electrode element may comprise a first deceleration electrode. The second electrode element may comprise a second deceleration electrode. And a gap between the first and the second deceleration electrodes may be adjustable based on the geometry of the ion beam.

In accordance with a further aspect of this particular exemplary embodiment, the first electrode element may comprise a first acceleration electrode. The second electrode element may comprise a second acceleration electrode. And a gap between the first and the second acceleration electrodes may be adjustable based on the geometry of the ion beam.

In accordance with a yet further aspect of this particular exemplary embodiment, the first electrode element may comprise a first suppression electrode. The second electrode element may comprise a second suppression electrode. And a gap between the first and the second suppression electrodes may be adjustable based on the geometry of the ion beam. At least one voltage potential associated with the first and the second suppression electrodes may be adjustable according to the aperture geometry.

In accordance with a still further aspect of this particular exemplary embodiment, the first electrode element may comprise a first ground electrode. The second electrode element may comprise a second ground electrode. And a gap between the first and the second ground electrodes may be adjustable based on the geometry of the ion beam.

In accordance with another aspect of this particular exemplary embodiment, the driver assembly may comprise a motor.

In accordance with yet another aspect of this particular exemplary embodiment, the aperture may be adapted to accommodate a first ion beam of a first height and a second ion beam of a second height.

In another particular exemplary embodiment, the technique may be realized as a method for variable-aperture ion beam manipulation in an ion implanter. The method may comprise the step of determining a geometry of an ion beam at a beam manipulation stage having an aperture. The method may also comprise the step of adjusting the aperture based on the geometry of the ion beam. The method may further comprise the step of allowing the ion beam to pass through the aperture.

In accordance with other aspects of this particular exemplary embodiment, the method may further comprise the steps of applying a voltage potential to one or more electrode elements at the beam manipulation stage and subjecting the ion beam to the voltage potential when the ion beam passes through the aperture. The step may additionally comprise the step of adjusting the voltage potential according the aperture geometry.

In accordance with further aspects of this particular exemplary embodiment, the adjustment of the aperture may be further based on a desired geometry of the ion beam after the ion beam passes through the aperture.

In yet another particular exemplary embodiment, the technique may be realized as at least one processor readable carrier for storing a computer program of instructions configured to be readable by at least one processor for instructing the at least one processor to execute a computer process for performing the method as recited above.

In still another particular exemplary embodiment, the technique may be realized as at least one signal embodied in at least one carrier wave for transmitting a computer program of instructions configured to be readable by at least one processor for instructing the at least one processor to execute a computer process for performing the method as recited above.

In a further particular exemplary embodiment, the technique may be realized as a variable aperture electrode. The variable aperture electrode may comprise an electrode element having at least one aperture and a driver assembly coupled to the electrode element, the driver assembly being adapted to alter said at least one aperture based on a geometry of an ion beam that is to pass through said at least one aperture.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

To solve the aforementioned problems associated with traditional ion implanters, embodiments of the present disclosure introduce a variable-aperture design concept for acceleration lenses, deceleration lenses and other similar beam-line components. Depending on the ion implanter's operation mode, the aperture shape and size of a beam-line component may be adaptively altered to accommodate different ion beam geometries. Thus, in all operation modes, the ion beam may be properly focused no matter what shape it is in.

Figure 1:
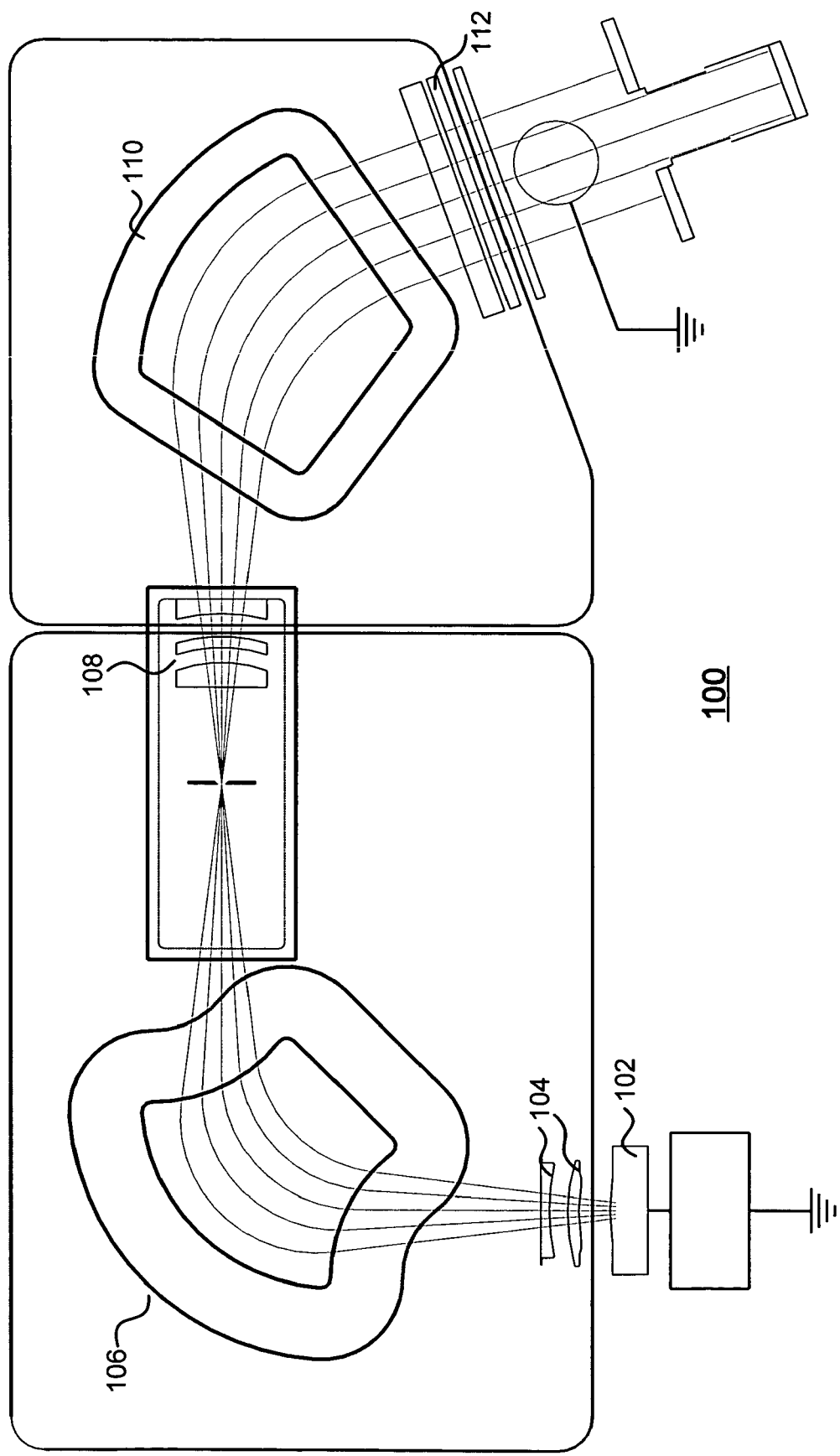
FIG. 1 shows a traditional ion implanter with two deceleration stages.
Figure 2:
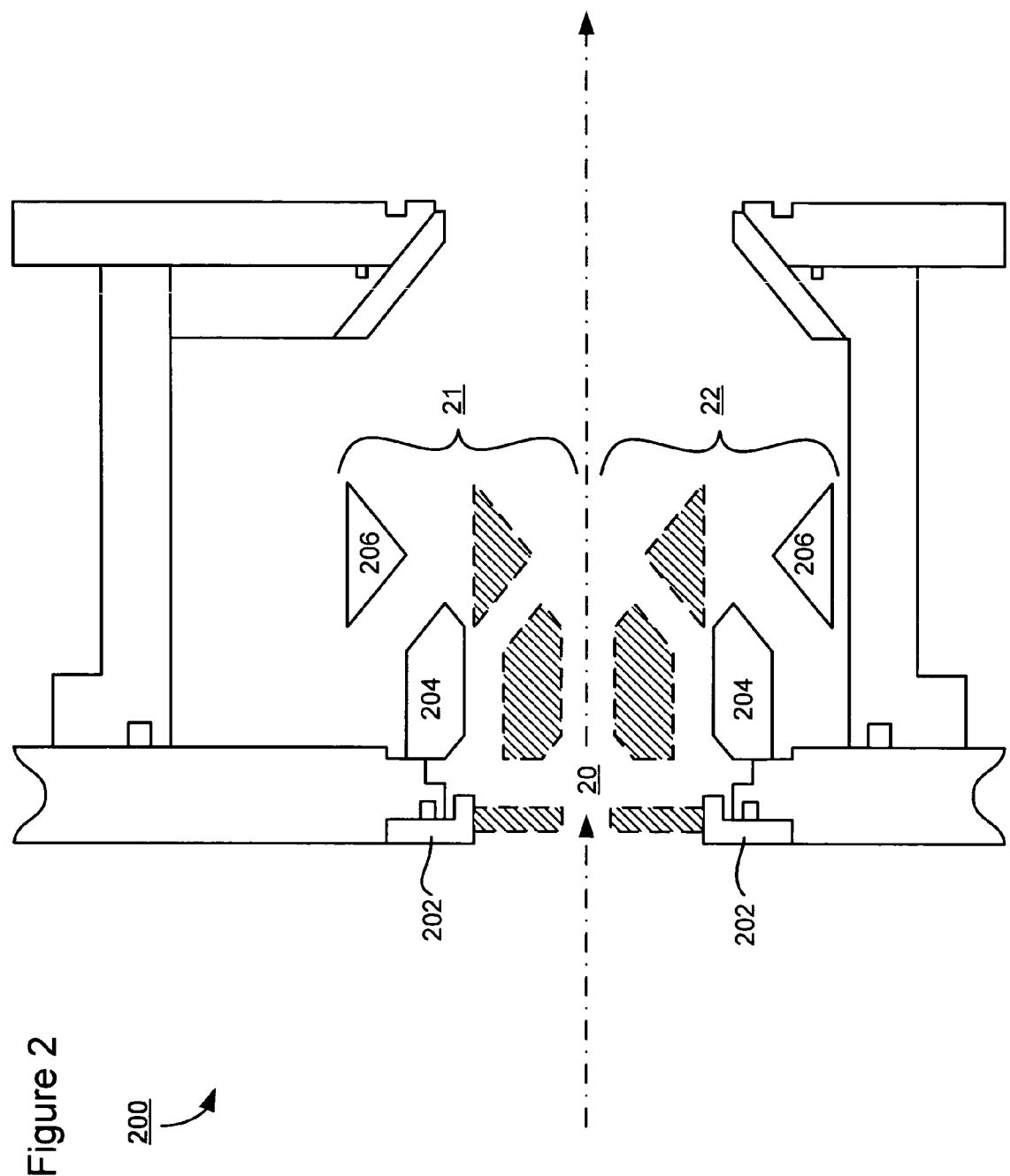
FIG. 2 shows a cross section of an exemplary variable aperture lens in accordance with an embodiment of the present disclosure.

Referring to FIG. 2, there is shown an exemplary variable aperture lens 200 in accordance with an embodiment of the present disclosure. The variable aperture lens 200 may comprise a first electrode element 21 and a second electrode element 22. The variable aperture lens 200 may also comprise a set of deceleration electrodes 202, a set of suppression electrodes 204, and a set of ground electrodes 206, for example. Each set of the electrodes may include two individual electrodes, one in the first electrode element 21 and the other in the second electrode element 22. An ion beam may pass through the deceleration lens 200 via an aperture (or beam path) 20 between the electrode elements 21 and 22.

Although three sets of electrodes (i.e., deceleration electrodes 202, suppression electrodes 204, and ground electrodes 206) are shown in the exemplary variable aperture lens 200, it should be noted that the concept of variable aperture lens described herein may be applicable to any lens configuration that might benefit from a variable aperture. For example, the variable aperture lens may comprise a graded-gap lens element and/or multiple sets of electrodes. Further, beam manipulation with the variable aperture lens is not limited to ion deceleration. It may include ion acceleration and/or any other process where a variable aperture might be beneficial.

The relative position between the first electrode element 21 and the second electrode element 22 may be adjusted such that the gap between the individual electrodes in each set of electrodes may be changed. A driver assembly (not shown in FIG. 2) may be coupled to either the first electrode element 21 or the second electrode element 22 or both. The driver assembly may cause the electrode elements 21 and 22 to move with respect to each other to change the geometry of the aperture 20. The shaded set of electrodes in FIG. 2 illustrates a narrower or smaller aperture configuration than the non-shaded set. A narrower aperture may be suitable for a PCD-mode ion beam, while a wider aperture may be suitable for a DD-mode ion beam.

According to embodiments of the present disclosure, the gaps for each set of electrodes may be changed either independently from or in synchronization with the other sets of electrodes. For example, the gap between the deceleration electrodes 202 may be changed by an amount that is the same as, proportionate to, or opposite of that of the gap between the suppression electrodes 204. Alternatively, the gap between the deceleration electrodes 202 may be changed while the gap between the suppression electrodes 204 is kept unchanged.

According to embodiments of the present disclosure, different voltage potentials may be applied to the electrodes according to different aperture geometries. For example, with a fixed, large-gap lens, the need for a particular field gradient to produce a desired beam quality often necessitates a relatively high potential be applied to the suppression electrodes (e.g., 204 in FIG. 2). If an ion changes its charge and becomes neutral in this region of high potential (thus high ion energy), its energy contamination is at a deeper level, and total energy contamination is increased. A variable gap lens allows the same field gradient to be achieved with a relatively lower potential on the suppression electrode and therefore may reduce the level of energy contamination.

Figure 3:
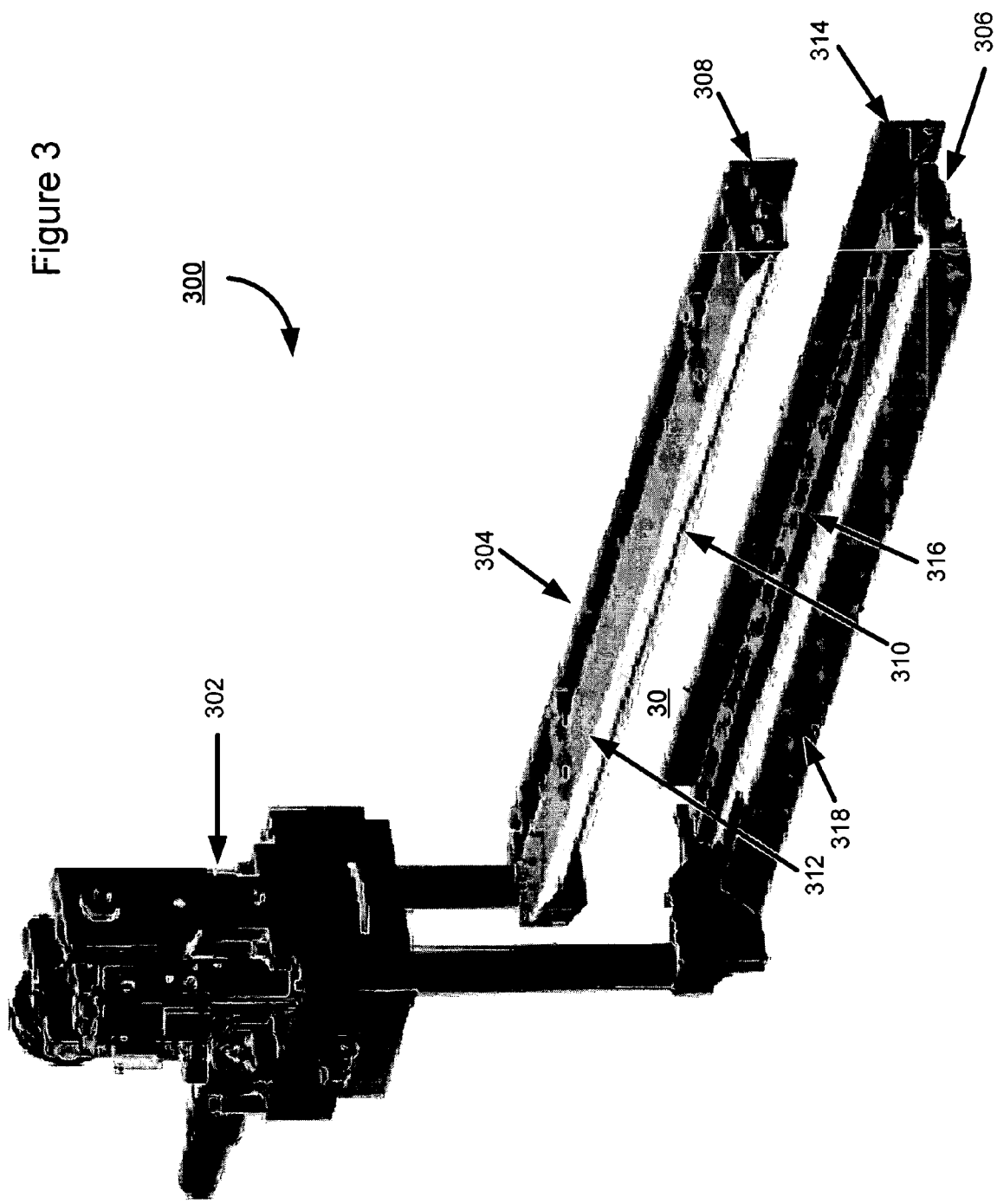
FIG. 3 is a perspective view of an exemplary variable aperture lens in accordance with an embodiment of the present disclosure.

FIG. 3 shows a perspective view of an exemplary variable aperture lens 300 in accordance with an embodiment of the present disclosure. The variable aperture lens 300 may comprise a side-mounted motor 302 (e.g., electrically or hydraulically activated motor) coupled to two horizontal arms 304 and 306. A deceleration electrode 308, a suppression electrode 310, and a ground electrode 312 may be attached to the horizontal arm 304. A corresponding set of deceleration electrode 314, suppression electrode 316, and a ground electrode 318 may be attached to the horizontal arm 306. The aperture (or vertical gap) 30 between the electrodes attached to the horizontal arm 304 and those attached to the horizontal arm 306 may be adjusted by using the side-mount motor 302 to drive the horizontal arms. A proper selection of voltage potentials applied to the deceleration electrodes (308 and 314), the suppression electrodes (310 and 316), and the ground electrodes (312 and 318) may produce a desired electrostatic field in the aperture 30 and its vicinity. With the adjusted aperture geometry and the electrostatic field, an ion beam that passes through the aperture 30 may be focused in the vertical direction, and may be decelerated or accelerated as desired.

Figure 4A:
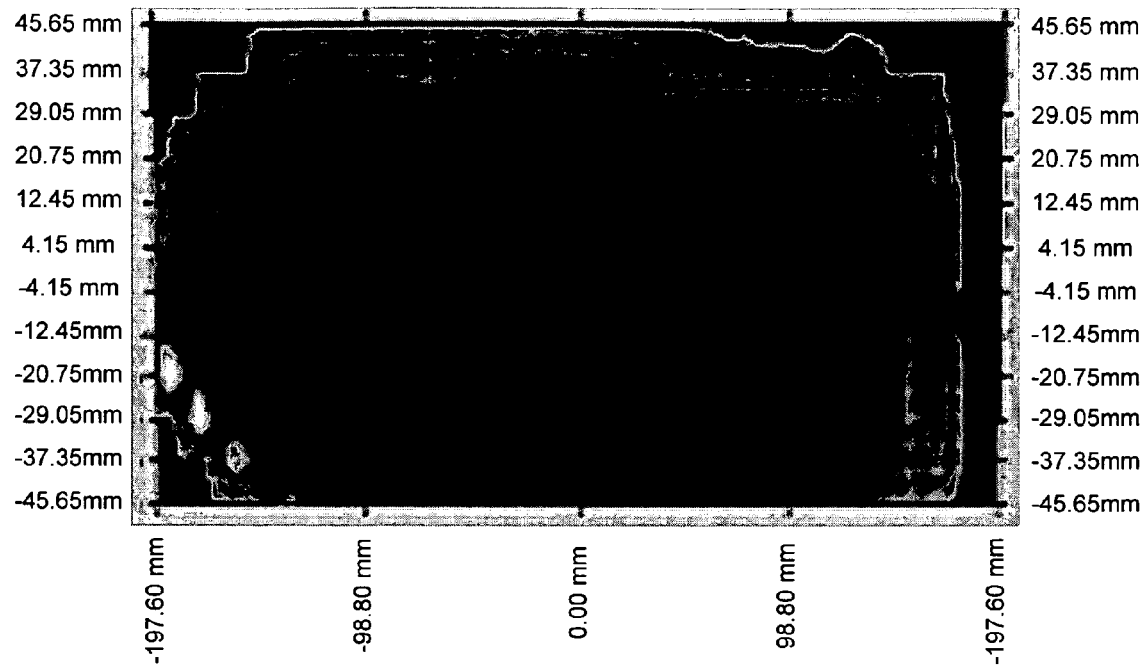
FIGS. 4a and 4b illustrate an effect of a variable aperture deceleration lens on ion beam characteristics in accordance with an embodiment of the present disclosure.
Figure 4B:
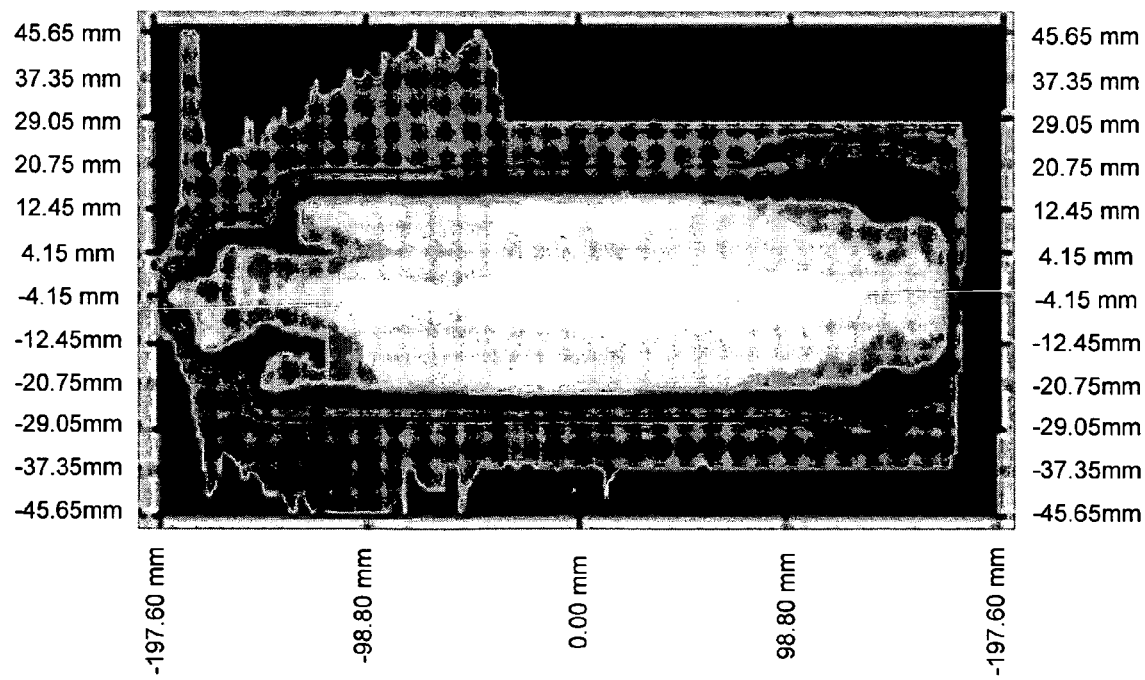

FIGS. 4a and 4b illustrate an effect of a variable aperture deceleration lens on ion beam characteristics in accordance with an embodiment of the present disclosure. FIG. 4a shows a beam density distribution taken at the wafer plane of a 5 keV PCD-mode $BF_2^+$ ion beam that has been decelerated at a D2 stage with a fixed-aperture design. Note that the ion beam spreads out in the vertical direction and the height of the ion beam is more than 90 mm. FIG. 4b shows a beam density distribution of a same or similar ion beam that has been decelerated at a D2 stage with a variable-aperture design. The aperture's vertical height has been reduced to be comparable to the beam height. The resulting ion beam observed at the wafer plane has a much more focused profile than the one shown in FIG. 4a. The ions are concentrated into a vertical range of about 66 mm with a 33-mm intensified core. The comparison between the profiles in FIG. 4a and FIG. 4a demonstrates an advantage of a variable aperture deceleration lens—the ability to control overall ion beam height at the wafer plane.

Figure 5:
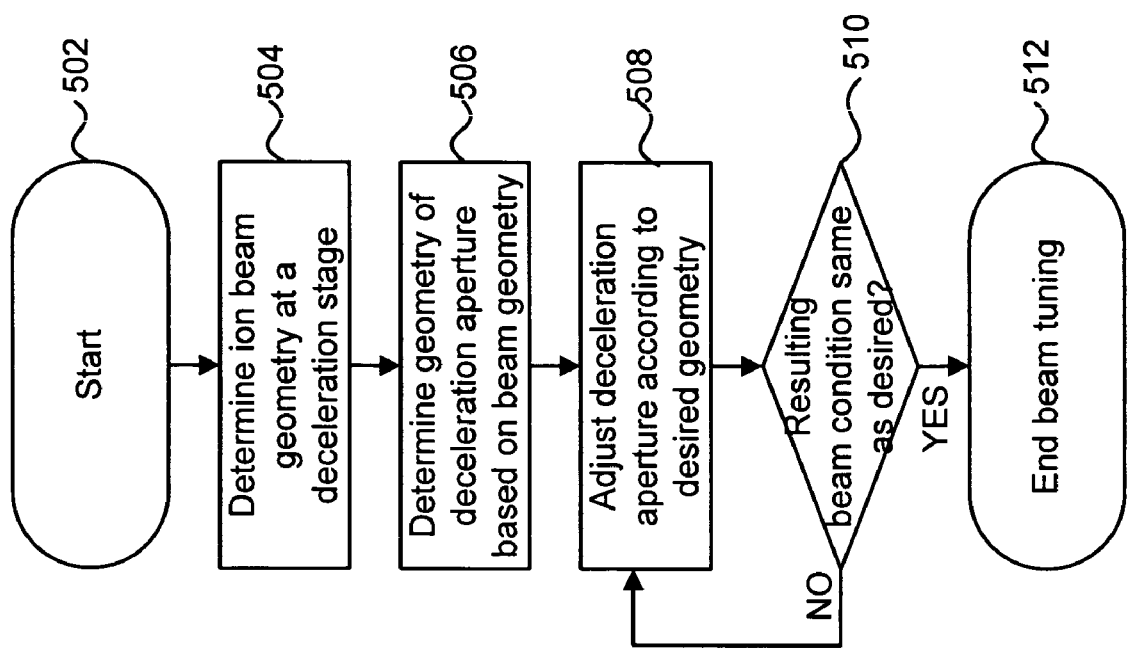
FIG. 5 is a flow chart illustrating an exemplary method for variable-aperture ion beam deceleration in accordance with an embodiment of the present disclosure.

FIG. 5 is a flow chart illustrating an exemplary method for variable-aperture ion beam deceleration in accordance with an embodiment of the present disclosure.

The exemplary method starts in step 502. In step 504, a geometry of an ion beam at a deceleration stage may be determined. The geometry of the ion beam may be affected by a number of factors including the operation mode of the ion implanter. Accordingly, the ion beam geometry may be determined based on real-time measurement, empirical data, mathematical modeling, or a combination thereof. The ion beam geometry may be typically represented by a current density distribution in the beam cross section.

In step 506, a deceleration aperture geometry may be determined based on the ion beam geometry. It is typically required that the deceleration aperture has a comparable geometry to that of the ion beam. For example, for a slit aperture to accommodate a ribbon-shaped ion beam, it may be desirable for the slit aperture to have a slit width just large enough to fit the vertical height of the ribbon-shaped ion beam. For a circular aperture to accommodate a spot beam, it may be desirable to make the aperture diameter similar to that of the beam spot. Once determined, the parameters for a desired aperture geometry may be recorded with reference to the corresponding ion beam geometry or other ion beam setup data. The recorded aperture parameters may be invoked when a same or similar ion beam is encountered in the future.

In step 508, the deceleration aperture may be adjusted according to the desired geometry. The aperture adjustment may be carried out during beam setup or beam tuning in advance of ion implantation. Alternatively, the aperture may be adjusted in real time during ion implantation.

In step 510, it may be determined whether a desired beam condition has been reached. If so, the beam tuning process may end in step 512. If a desired beam condition has not been reached, the aperture adjustment may be repeated in step 508 until the desired result is obtained. According to one embodiment of the disclosure, a feedback loop may be established to dynamically tune the deceleration aperture based on real-time measurement of the ion beam geometry. With a feedback loop, an optimal aperture geometry may be quickly achieved and constantly maintained. One example of such a feedback loop is described below in connection with FIG. 6.

Figure 6:
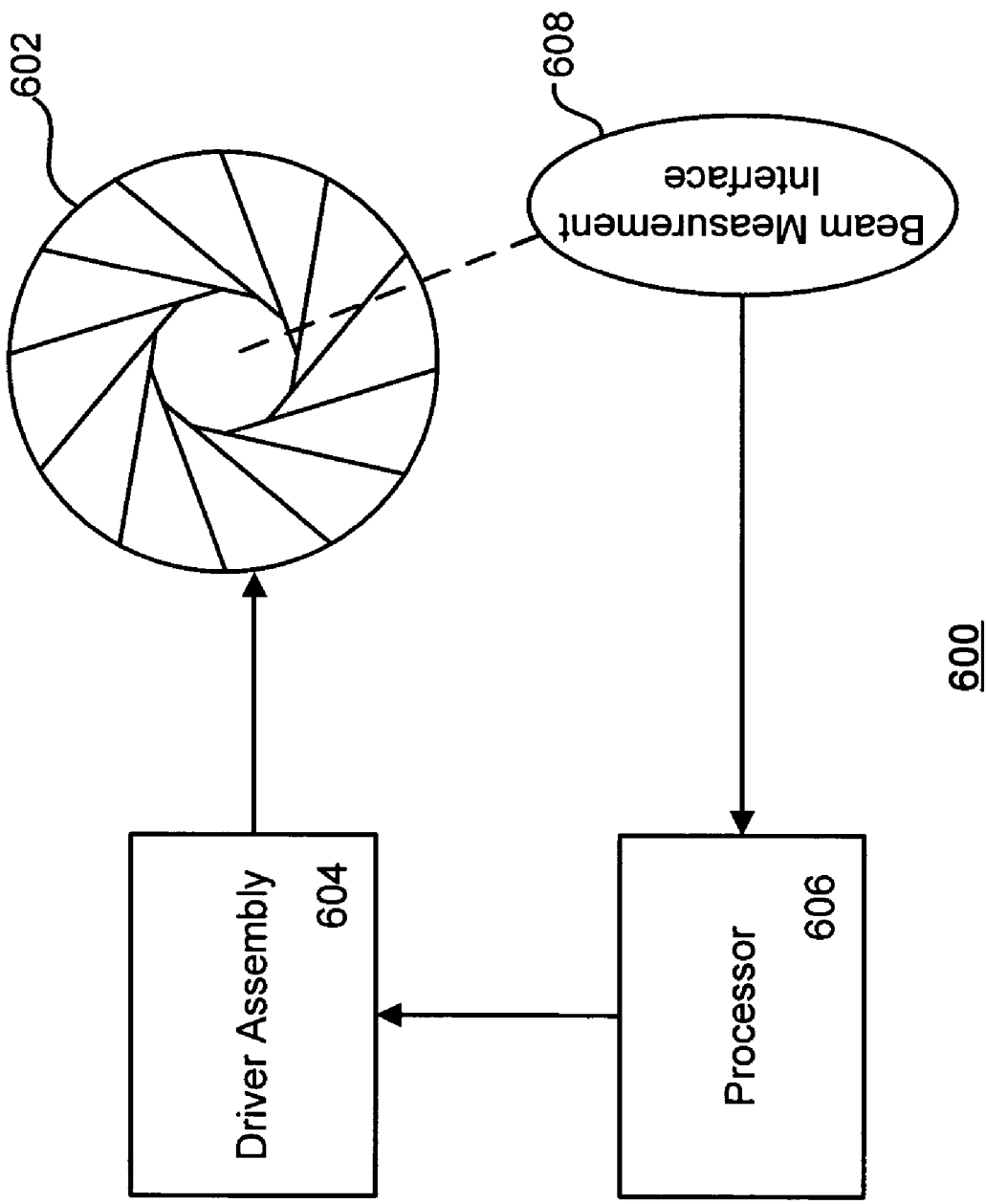
FIG. 6 is a block diagram illustrating an exemplary system for variable-aperture ion beam deceleration in accordance with an embodiment of the present disclosure.

Referring to FIG. 6, there is shown a block diagram illustrating an exemplary system 600 for implementing a variable aperture lens in accordance with an embodiment of the present disclosure. The system 600 may be a stand-alone or add-on unit for an ion implanter. Alternatively, the system 600 may be a subsystem of the ion implanter.

The system 600 may comprise a variable aperture lens 602 with an aperture that may be altered through a driver assembly 604. The system 600 may also comprise a processor unit 606 which may be a microprocessor, microcontroller, personal computer (PC) or any other processing device. The processor unit 606 may be coupled to the driver assembly 606 and a beam measurement interface 608. In operation, the processor unit 606 may receive measurement data regarding the geometry of an ion beam (e.g., density distribution) via the beam measurement interface 608. The processor unit 606 may then determine a desired geometry for the variable aperture in the variable aperture lens 602. Parameters of the desired aperture geometry may be communicated to the driver assembly 604. Based on these parameters, the driver assembly 604 may adjust the variable aperture to the desired shape and/or size.

At this point it should be noted that implementing a variable aperture lens in accordance with the present disclosure as described above may involve the processing of input data and the generation of output data to some extent. This input data processing and output data generation may be implemented in hardware or software. For example, specific electronic components may be employed in an ion implanter or similar or related circuitry to implement the functions associated with a variable aperture lens in accordance with the present disclosure as described above. Alternatively, one or more processors operating in accordance with stored instructions may be employed to implement the functions associated with a variable aperture lens in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A variable aperture lens comprising:
   a first electrode element;
   a second electrode element; and
   a driver assembly coupled to at least one of the first and the second electrode elements;
   wherein the driver assembly alters an aperture between the first and the second electrode elements based on a geometry of an ion beam.

2. The variable aperture lens according to claim 1, wherein the aperture is altered based on a geometry of the ion beam before the ion beam enters the aperture.

3. The variable aperture lens according to claim 1, wherein the aperture is altered according to a desired geometry of the ion beam after the ion beam passes through the aperture.

4. The variable aperture lens according to claim 1, wherein:
   the first electrode element comprises a first deceleration electrode;
   the second electrode element comprises a second deceleration electrode; and
   a gap between the first and the second deceleration electrodes is adjustable based on the geometry of the ion beam.

5. The variable aperture lens according to claim 1, wherein:
   the first electrode element comprises a first acceleration electrode;
   the second electrode element comprises a second acceleration electrode; and
   a gap between the first and the second acceleration electrodes is adjustable based on the geometry of the ion beam.

6. The variable aperture lens according to claim 1, wherein:
   the first electrode element comprises a first suppression electrode;
   the second electrode element comprises a second suppression electrode; and
   a gap between the first and the second suppression electrodes is adjustable based on the geometry of the ion beam.

7. The variable aperture lens according to claim 6, wherein at least one voltage potential associated with the first and the second suppression electrodes is adjustable according to the aperture geometry.

8. The variable aperture lens according to claim 1, wherein:
   the first electrode element comprises a first ground electrode;
   the second electrode element comprises a second ground electrode; and
   a gap between the first and the second ground electrodes is adjustable based on the geometry of the ion beam.

9. The variable aperture lens according to claim 1, wherein the driver assembly comprises a motor.

10. The variable aperture lens according to claim 1, wherein the aperture is adapted to accommodate a first ion beam of a first height and a second ion beam of a second height.

11. A method for variable-aperture ion beam manipulation in an ion implanter, the method comprising the steps of:
    determining a geometry of an ion beam at a beam manipulation stage having an aperture;
    adjusting the aperture based on the geometry of the ion beam; and
    allowing the ion beam to pass through the aperture.

12. The method according to claim 11 further comprising:
    applying a voltage potential to one or more electrode elements at the beam manipulation stage; and
    subjecting the ion beam to the voltage potential when the ion beam passes through the aperture.

13. The method according to claim 12 further comprising:
    adjusting the voltage potential according the aperture geometry.

14. The method according to claim 11, wherein the adjustment of the aperture is further based on a desired geometry of the ion beam after the ion beam passes through the aperture.

15. At least one signal embodied in at least one carrier wave for transmitting a computer program of instructions configured to be readable by at least one processor for instructing the at least one processor to execute a computer process for performing the method as recited in claim 11.

16. At least one processor readable carrier for storing a computer program of instructions configured to be readable by at least one processor for instructing the at least one processor to execute a computer process for performing the method as recited in claim 11.

17. A variable aperture electrode comprising:
    an electrode element having at least one aperture; and
    a driver assembly coupled to said electrode element, said driver assembly being adapted to alter said at least one aperture based on a geometry of an ion beam that is to pass through said at least one aperture.

* * * * *